US012601804B2

(12) United States Patent
Warntjes

(10) Patent No.: US 12,601,804 B2
(45) Date of Patent: Apr. 14, 2026

(54) METHOD AND SYSTEM OF MULTI-PARAMETRIC MAGNETIC RESONANCE IMAGING

(71) Applicant: SyntheticMR AB (publ), Linköping (SE)

(72) Inventor: Marcel Warntjes, Linköping (SE)

(73) Assignee: SYNTHETICMR AB (publ), Linköping (SE)

( * ) Notice: Subject to any disclaimer, the term of this patent is extended or adjusted under 35 U.S.C. 154(b) by 216 days.

(21) Appl. No.: 18/538,424

(22) Filed: Dec. 13, 2023

(65) Prior Publication Data

US 2025/0199102 A1       Jun. 19, 2025

(51) Int. Cl.

| *G01V 3/00* | (2006.01) |
| *G01R 33/48* | (2006.01) |
| *G01R 33/50* | (2006.01) |
| *G01R 33/561* | (2006.01) |

(52) U.S. Cl.
CPC ......... *G01R 33/50* (2013.01); *G01R 33/4828* (2013.01); *G01R 33/5615* (2013.01)

(58) Field of Classification Search
CPC .............. G01R 33/5608; G01R 33/385; G01R 33/4824; G01R 33/4828; G01R 33/50; G01R 33/561; A61B 5/4312; A61B 5/004
USPC ....................................... 324/309
See application file for complete search history.

(56) References Cited

U.S. PATENT DOCUMENTS

| 2014/0126795 A1* | 5/2014 | Zhong ................ G01R 33/4828 |
| | | 324/309 |
| 2015/0177350 A1* | 6/2015 | Warntjes ................ G01R 33/50 |
| | | 324/309 |
| 2016/0231405 A1* | 8/2016 | Eggers ................ G01R 33/5611 |

FOREIGN PATENT DOCUMENTS

| CN | 105182264 B | * | 11/2018 | ............. G01R 33/46 |
| CN | 112285623 A | * | 1/2021 | ............. A61B 5/055 |
| CN | 117192456 A | * | 12/2023 | |
| EP | 3495832 A1 | * | 6/2019 | ............... G06T 5/50 |

OTHER PUBLICATIONS

Shohei Fujita, et al., "Three-dimensional high-resolution simultaneous quantitative mapping of the whole brain with 3D-QALAS: An accuracy and repeatability study", Elsevier Inc., Aug. 19, 2019, 9 pages.

(Continued)

*Primary Examiner* — Walter L Lindsay, Jr.
*Assistant Examiner* — Frederick Wenderoth
(74) *Attorney, Agent, or Firm* — Getech Law LLC; Jun Ye

(57) ABSTRACT

According to an aspect of the present inventive concept there is provided a method of magnetic resonance (MR) imaging of an object positioned in an examination volume of an MR scanning device, the method comprising: acquiring, by the MR scanning device, multiple parallel, segmented acquisitions from the object, comprising: applying an R2 sensitizing phase; acquiring a first acquisition; applying an R1 sensitizing phase; acquiring a second acquisition; waiting for a delay time; and acquiring a third acquisition; wherein each acquisition comprises measuring at least three echoes at different echo times (TE); calculating multiple physical properties of the object based on at least some of the at least three acquisitions.

18 Claims, 4 Drawing Sheets

(56)          References Cited

OTHER PUBLICATIONS

Mayumi Higashi, et al., "Impact of fat on the apparent T1 value of the liver: assessment by water-only derived T1 mapping", European Society of Radiology 2023, Aug. 8, 2023, 8 pages.
Catherine D. G. Hines, et al., "T1 Independent, T2* Corrected MRI with Accurate Spectral Modeling for Quantification of Fat: Validation in a Fat-Water-SPIO Phantom", NIH Public Access, Nov. 2009, 15 pages.
Sofia Kvernby, et al., "Simultaneous three-dimensional myocardial T1 and T2 mapping in one breath hold with 3D-QALAS", Journal of Cardiovascular Magnetic Resonance, 2014, 14 pages.
Deep B. Gandhi, et al., "Liver T1 Relaxation Quantification Using a 3-Dimensional Interleaved Look-Locker Acquisition With T2 Preparation Pulse Sequence (3D-QALAS): Comparison With Conventional 2-Dimensional MOLLI", Wolters Kluwer Health, J. Comput Assist Tomogr, vol. 47, No. 3, May/Jun. 2023, 5 pages.
Isil Yurdaisik, et al., "Accuracy of Multi-echo Dixon Sequence in Quantification of Hepatic Steatosis", Cureus, Feb. 25, 2020, 9 pages.

\* cited by examiner

S1 — R2 sensitizing phase

S2 — First acquisition

S3 — R1 sensitizing phase

S4 — Second acquisition

S5 — Delay

S6 — Third acquisition

S7 — Fourth acquisition

S8 — Fifth acquisition

S9 — Calculating physical properties

METHOD AND SYSTEM OF MULTI-PARAMETRIC MAGNETIC RESONANCE IMAGING

TECHNICAL FIELD

The present description relates to a method and system of magnetic resonance imaging of an object for calculating multiple physical properties of the object.

BACKGROUND

The MRI (Magnetic Resonance Imaging) techniques are generally based on relaxation properties of excited hydrogen nuclei (protons) of an object under test. When the object is placed in a powerful, uniform magnetic field of an MR scanning device, the spins of the atomic nuclei of water in the object with non-integer spin numbers within the object all align either parallel or anti-parallel to the magnetic field. By scanning the object to be imaged with the MR scanning device, several physical properties of the object under test can be determined. An MR image can be reconstructed based on an acquired magnetic resonance sequence generated with the excitation.

The following time constants involved in the relaxation processes, which establish equilibrium following RF excitation, should be introduced in order to understand the MRI techniques. A nuclear magnetic resonance signal is affected by two simultaneous relaxation processes. The loss of coherence of the spin system attenuates the MRI signal with a time constant called a transverse relaxation time (T2). Concurrently, the magnetization vector slowly relaxes towards its equilibrium orientation that is parallel to the magnetic field by a time constant called longitudinal relaxation time (T1). A longitudinal relaxation rate R1 is the reciprocal of the longitudinal relaxation time T1 (R1=1/T1). A transverse relaxation rate R2 is the reciprocal of the transverse relaxation time T2 (R2=1/T2). The relaxation times T1 and T2 are typically measured in milliseconds (ms) or seconds(s). The corresponding relaxation rates R1 and R2 are therefore measured in units of $ms^{-1}$ or $s^{-1}$.

Proton density refers to a concentration of protons in a tissue, wherein the protons are the hydrogen nuclei that resonate and give rise to the nuclear magnetic resonance signal. Since most visible tissue protons are resident in water, it is often seen as looking at a water content. The proton density of a tissue usually refers to the concentration of protons in the tissue, relative to that in the same volume of water at the same temperature.

Normally, an acquired MRI sequence can result in images of the same anatomical section under different contrasts, such as T1-weighted, T2-weighted and PD-weighted (Proton Density-weighted) images. The MRI techniques relies on differences in relaxation properties and proton density of the imaged tissue to display the different tissues with contrast, e.g., in different signal intensities or different colors, in the resulting MR images. The contrast in MR images originates from the fact that different tissues have, in general, different physical properties, such as different R1 and R2 relaxation rates, different proton densities, etc.

In clinical practice, in order to acquire quantitative values of different physical properties of an object, multiples separate MR scans are typically needed. However, since many physical properties are not entirely independent, it may result in the requirement of modeling the MRI signals with assumed values for some other physical properties. Inevitably, it may also lead to a less accurate result due to miscalculation and/or bias. Furthermore, the patients must undertake excessive scan time due to the multiples separate MR scans.

Hence, there is a need for an improved MRI method and system for calculating multiple physical properties of an object.

SUMMARY

An objective of the present description is to provide an improved MRI method and system for a combined measurement of multiple physical properties of an object, such that the accuracy of the calculation can be improved. Since the multiple physical properties can be measured by a single MR scan, all necessary corrections and cross dependencies of the physical properties can be performed using measured values and perfect registration. Further, by reducing the number of MR scans for measuring the multiple physical properties, the scan time can also be greatly reduced.

According to a first aspect, there is provided a method of magnetic resonance (MR) imaging of an object positioned in an examination volume of an MR scanning device. The method comprises:

acquiring, by the MR scanning device, multiple parallel, segmented acquisitions from the object, comprising:
        applying an R2 sensitizing phase;
        acquiring a first acquisition;
        applying an R1 sensitizing phase;
        acquiring a second acquisition;
        waiting for a delay time; and
        acquiring a third acquisition;
    wherein each acquisition comprises measuring at least three echoes at different echo times (TE);
    calculating multiple physical properties of the object based on at least some of the at least three acquisitions.

The method may comprise repeating the step of acquiring multiple parallel, segmented acquisitions from the object for MR image reconstruction.

The method may comprise after the step of acquiring a third acquisition, acquiring a fourth acquisition; and acquiring a fifth acquisition.

Each acquisition may comprise measuring at least four echoes at different echo times (TE).

The multiple physical properties may comprise any of: R1 relaxation rate, R2 relaxation rate, T1 relaxation time, T2 relaxation time, proton density (PD), T2* relaxation time, a water fraction, a fat fraction, a macro-molecular fraction, and proton density fat fraction (PDFF).

The R2 sensitizing phase may consist of a 90° Radio Frequency (RF) pulse, at least one refocusing pulse, and a −90° RF pulse.

The R1 sensitizing phase may comprise a 180° RF inversion pulse.

The step of calculating multiple physical properties of the object may comprise calculating T1 relaxation time based on those acquisitions of the multiple parallel, segmented acquisitions which are performed after the step of applying the R1 sensitizing phase.

The step of calculating multiple physical properties of the object may comprise calculating T2 relaxation time based on those acquisitions of the multiple parallel, segmented acquisitions which are performed before and after the step of applying the R2 sensitizing phase.

The step of calculating multiple physical properties of the object may comprise calculating T2* relaxation time based the at least three echoes of at least one acquisition of the multiple parallel, segmented acquisitions.

The step of calculating multiple physical properties of the object may comprise calculating a water fraction and a fat fraction based on at least two echoes of the at least three echoes of at least one acquisition of the multiple parallel, segmented acquisitions.

The step of calculating multiple physical properties of the object may comprise calculating a macro-molecular fraction by using 100% subtracting a sum of the water fraction and the fat fraction.

The step of calculating multiple physical properties of the object may comprise calculating proton density fat fraction (PDFF) by dividing the fat fraction by the sum of the water fraction and the fat fraction.

T1 relaxation time, T2 relaxation time, T2* relaxation time, Proton Density PD, a water fraction and a fat fraction may be calculated using the following equation:

$$I =$$

$$W\left[M0w - (M0w - MIw) * \exp\left(-\frac{TI}{T_1 w}\right)\right] * \exp\left(-\frac{TE}{T_2^* w}\right) * \exp(i\varphi_0 + iATE) +$$

$$F\left[M0f - (M0f - MIf) * \exp\left(-\frac{TI}{T_1 f}\right)\right] * \exp\left(-\frac{TE}{T_2^* f}\right) * \exp(i\varphi_0 + iBTE)$$

wherein I is signal intensity,

W is the water fraction,

M0w is an unsaturated magnetization of water,

MIw is a magnetization of water directly after an inversion pulse,

TI is a delay time after an inversion pulse, $T_1 w$ is a T1 relaxation time of water, TE is an echo time after each RF pulse, $T_2^* w$ is a $T2^*$ relaxation time of water, $\varphi_0$ is a starting phase at TE=0, A is a phase evolution of water, F is a fat fraction, M0f is an unsaturated magnetization of fat, MIf is a magnetization of fat directly after an inversion pulse, $T_1 f$ is a T1 relaxation time of fat, $T_2^* f$ is a $T2^*$ relaxation time of fat, and B is a phase evolution of fat.

Among the at least three echoes, water and fat of the object may be in-phase at at least one echo, and water and fat of the object may be out-of-phase at at least another echo.

The method may comprise repeating the step of acquiring multiple parallel, segmented acquisitions from the object for at least twice.

Each acquisition may comprise performing a multi-echo Dixon imaging for measuring the at least three echoes.

The multiple parallel, segmented acquisitions may be performed on a two-dimensional (2D) slice, or a three-dimensional (3D) slice of the object.

The slice of the object may comprise at least a part of a liver, of a pancreas, of a kidney, of a heart, or any other organs, of a human or an animal.

According to a second aspect, there is provided a magnetic resonance imaging (MRI) system, comprising an MR scanning device, configured to acquire multiple parallel, segmented acquisitions from an object positioned in an examination volume of the MR scanning device, and a processing circuit, configured to calculate multiple physical properties of the object based on at least some of the at least three acquisitions. The MR scanning device is configured to:

apply an R2 sensitizing phase;

acquire a first acquisition;

apply an R1 sensitizing phase;

acquire a second acquisition;

wait for a delay time; and acquire a third acquisition;

wherein each acquisition comprises measuring at least three echoes at different echo times (TE).

According to a third aspect, there is provided a non-transitory computer readable recording medium having computer readable program code recorded thereon which when executed on a device having processing capability is configured to perform the method of the first aspect.

The second and the third aspect may generally present the same or corresponding advantages as the former aspect.

BRIEF DESCRIPTION OF THE DRAWINGS

The above, as well as additional objects, features, and advantages of the present description, will be better understood through the following illustrative and non-limiting detailed description, with reference to the appended drawings.

DETAILED DESCRIPTION

In clinical practice, to assess the pathological evolution, e.g., of the liver of a patient, multiple MR scans are needed to measure different physical properties, e.g., of the liver, including such as water and fat fraction measurements, T1 relaxation time (R1 relaxation rate) measurements, and T2* relaxation time (R2* relaxation rate) measurements, etc. It is known that these parameters or physical properties are not entirely independent.

For example, the calculation of water and fat fraction can be done by acquiring multiple echoes at different echo times (TE) for showing an oscillatory behavior of the signal intensity due to the frequency difference between water and fat, see e.g., Yurdaisik et al. "*Accuracy of Multi-echo Dixon Sequence in Quantification of Hepatic Steatosis*", *Cureus* 2020; 12:e7103.

However, all signals simultaneously decline over time due to the T2* relaxation. Furthermore, it is known that the acquisition will be saturated due to that the T1 relaxation time being longer than the repetition time of the acquisition, see e.g., Hines et al. "*T1 independent, T2* corrected MRI with accurate spectral modeling for quantification of fat: validation in a fat-water-SPIO phantom*", *J Magn Reson Imaging* 2009; 30:1215-22.

On the other hand, since water and fat contribute with different T1 relaxation components, a T1 relaxation time measurement by applying an inversion pulse is affected by the composition of water and fat of the tissue of the examined object, see e.g., Higashi et al. *"Impact of fat on the apparent T1 value of the liver: assessment by water-only derived T1 mapping"* Eur Radiol 2023; 33:6844-6851.

For iron measurement, typically T2* relaxation time is taken as a surrogate marker, but physically there is a baseline offset of the tissue's T2 relaxation time. Iron concentration is proportional to R2* relaxation rate (1/T2*), but has a baseline starting at R2 relaxation rate (1/T2). Therefore, iron concentration is linearly proportional to R2', which is equivalent to R2*–R2.

In spite of these cross dependencies, in clinical practice these measurements are made by separate MR scans, resulting in the requirement of modeling the MRI signals with assumed values for the other parameters (physical properties). Thus, the accuracy of the measurement result is reduced, and the scan time is increased.

In order to solve the above-mentioned issues, the present description proposed a method and a system which can enable a combined calculation of multiple physical properties of an object positioned in an examination volume of an MR scanning device by a single MR scan, such that the accuracy of the measurement result is increased and the required scan time is reduced.

Figure 7:
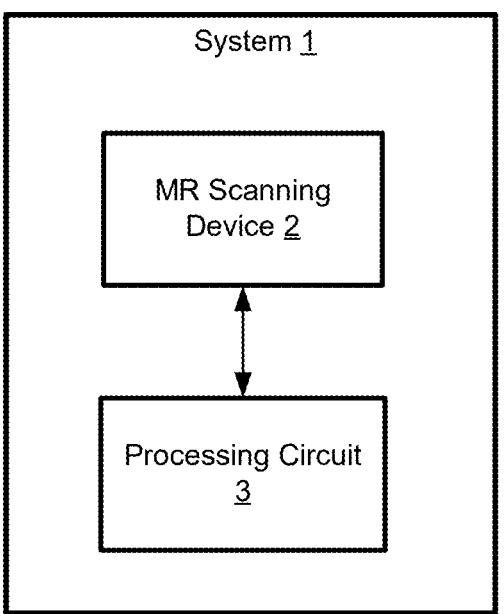
FIG. 7 is a schematic block diagram of an example MRI system.

In connection with FIG. 7, the example MRI system 1 will be discussed in more detail. The MRI system 1 comprises an MR scanning device 2 and a processing circuit 3.

The MR scanning device 2 is configured to acquire MR data by scanning an object positioned in an examination volume of the MR scanning device 2. The MR data is acquired by performing multiple parallel, segmented acquisitions, e.g., resulting one or more MR sequences comprising information of the object.

The acquired MR data may be in the form of MR images or data sets representing information of the object. The acquired MR data of the multiple parallel, segmented acquisitions may comprise quantitative information of the object. For example, the quantitative information may include a longitudinal relaxation rate R1, and a transverse relaxation rate R2, etc. of tissues of the object.

Parallel acquisitions may refer to that multiple MR images or data sets are acquired in parallel.

A segmented acquisition may refer to that only a part of the acquisition is performed per repetition time (TR). A full acquisition can be obtained by repeating the TR until the acquisition is complete. MR Images or data sets can be acquired in parallel by consecutive measurement of small segments of the separate MR images or data sets.

The acquisition may be any gradient echo type, such as a spoiled gradient acquisition (also called turbo field echo, TFE), a balanced steady state free precession acquisition (bSSFP, also called balanced turbo field echo, bTFE), an echo planar imaging acquisition (EPI) or a combination of a TFE and an EPI acquisition.

The MR scanning device 2 is configured to acquire multiple parallel, segmented acquisitions from the object, comprising:

apply an R2 sensitizing phase;
acquire a first acquisition;
apply an R1 sensitizing phase;
acquire a second acquisition;
wait for a delay time; and
acquire a third acquisition.

Each acquisition comprises measuring at least three echoes at different echo times (TE).

The MR scanning device 2 is further connected to the processing circuit 3 for processing the MR data acquired by the MR scanning device 2. The processing circuit 3 is configured to calculate multiple physical properties of the object based on at least some of the at least three acquisitions.

The processing circuit 3 may be configured to carry out overall control of functions and operations of the MRI system 1.

The processing circuit 3 may include a processor, such as a central processing unit (CPU), microcontroller, or microprocessor. The MRI system 1 may comprise a memory. The processing circuit 3 may be configured to execute program codes stored in the memory, in order to carry out functions and operations of the MRI system 1.

The memory may be one or more of a buffer, a flash memory, a hard drive, a removable medium, a volatile memory, a non-volatile memory, a random access memory (RAM), or another suitable device. In a typical arrangement, the memory may include a non-volatile memory for long term data storage and a volatile memory that functions as system memory for the MRI system 1. The memory may exchange data with the processing circuit 3 over a data bus. Accompanying control lines and an address bus between the memory and the processing circuit 3 also may be present.

Functions and operations of the MRI system 1 may be embodied in the form of executable logic routines (e.g., lines of code, software programs, etc.) that are stored on a non-transitory computer readable medium (e.g., the memory) of the MRI system 1 and are executed by the processing circuit 3. Furthermore, the functions and operations of the MRI system 1 may be a stand-alone software application or form a part of a software application that carries out additional tasks related to the MRI system 1. The described functions and operations may be considered a method that the corresponding device is configured to carry out. Also, while the described functions and operations may be implemented in software, such functionality may as well be carried out via dedicated hardware or firmware, or some combination of hardware, firmware and/or software.

The MRI system 1 may comprise a user interface. The user interface may be configured to output data and information, e.g., the calculate multiple physical properties of the object, and/or the parameter maps for visualizing the multiple physical properties. The user interface may be configured to receive data and information, such as a command, from one or several input devices. The input device may be a computer mouse, a keyboard, a track ball, a touch screen, or any other input device. The user interface may send the received data and information to the processing circuit for further processing.

The R2 sensitizing phase may consist of a 90° Radio Frequency (RF) pulse, at least one refocusing pulse, and a –90° RF pulse.

The R2 sensitizing phase is intended to affect the longitudinal magnetization Mz proportional to the T2 relaxation time. T2 relaxation time refers to the time it takes for the Mxy magnetization of protons in the tissues to randomize their phases. This leads to a relative signal loss for tissues having a short T2 relaxation time in comparison to tissues with a long T2 relaxation time, increasing contrast between tissues with different T2 relaxation time, allowing for better visualization and differentiation.

The R1 sensitizing phase may comprise a 180° RF inversion pulse.

The R1 sensitizing phase is intended to invert the longitudinal magnetization Mz. T1 relaxation time refers to the time it takes for the protons in the tissues to recover their original Mz magnetization along the direction of the magnetic field after being disturbed. By accentuating the T1 relaxation time difference between tissues, the contrast between different tissues can be enhanced, for highlighting specific structures or abnormalities in the MR images.

The multiple physical properties may comprise any of: R1 relaxation rate, R2 relaxation rate, T1 relaxation time, T2 relaxation time, proton density (PD), T2* relaxation time, a water fraction, a fat fraction, a macro-molecular fraction, and proton density fat fraction (PDFF).

The calculated multiple physical properties is quantitative. That is, the absolute values of the physical properties are calculated, instead of relative values.

The absolute PD, i.e. the total number of visible protons in each voxel of the acquired MR images or data sets, can be calculated. These protons can be protons of either water or fat of the tissue represented by the voxel.

In connection with FIG. 1, an example MR method for imaging an object positioned in an examination volume of an MR scanning device will be discussed in detail.

The method comprises acquiring, by the MR scanning device, multiple parallel, segmented acquisitions from the object, comprising:

applying an R2 sensitizing phase (S1);

acquiring a first acquisition (S2);

applying an R1 sensitizing phase (S3);

acquiring a second acquisition (S4);

waiting for a delay time (S5);

acquiring a third acquisition (S6); and calculating multiple physical properties of the object based on at least some of the at least three acquisitions (S9).

3D-QALAS or 3D-QALAS sequence is known to be based on multiple segmented, parallel acquisitions of the same volume, interleaved with an R2-sensitizing phase applied prior to the first acquisition, for providing a measurement of the T2 relaxation time, which is proportional to the ratio of the signal intensity before and after the R2 sensitizing phase; and interleaved with an R1 sensitizing phase applied prior to the second acquisition while a delay is applied prior to the third and any additional acquisitions, e.g., a fourth and fifth acquisition. The latter provides the T1 relaxation time by fitting an exponential curve to these 4 data points. Extrapolation to infinity of the R1 relaxation rate curve provides an estimate of proton density PD.

Thus, 3D-QALAS, i.e. a single MR scan comprising multiple parallel, segmented acquisitions interleaved with an R2-sensitizing phase and an R1-sensitizing phase, can determine multiple physical properties or parameters, such as T1 relaxation time (R1 relaxation rate), T2 relaxation time (R2 relaxation rate), and proton density (PD) of the examined object. Research for 3D-QALAS measurements on the heart, the liver, and the brain can be seen in Kvernby et al. "*Simultaneous three-dimensional myocardial T1 and T2 mapping in one breath hold with 3D-QALAS*", J Cardiovasc Magn Reason, 2014; 16:102; Gandhi et al. "*Liver T1 Relaxation Quantification Using a 3-Dimensional Interleaved Look-Locker Acquisition With T2 Preparation Pulse Sequence (3D-QALAS): Comparison With Conventional 2-Dimensional MOLLI*", J Comput Assist Tomogr, 2023; 47:350-354; Fujita et al. "*Three-dimensional high-resolution simultaneous quantitative mapping of the whole brain with 3D-QALAS: An accuracy and repeatability study*", Magn Reson Imaging, 2019; 63:235-243.

3D-QALAS sequence is acquired using a single echo time. That is, for each acquisition, only a single echo is measured. In other words, all acquired volumes are represented by the signal intensity at that specific echo time, typically at 2.3 ms for 3 T.

Being different from 3D-QALAS, each of the acquisitions of the method of the present description comprises measuring at least three echoes at different echo times (TE).

Figure 1:
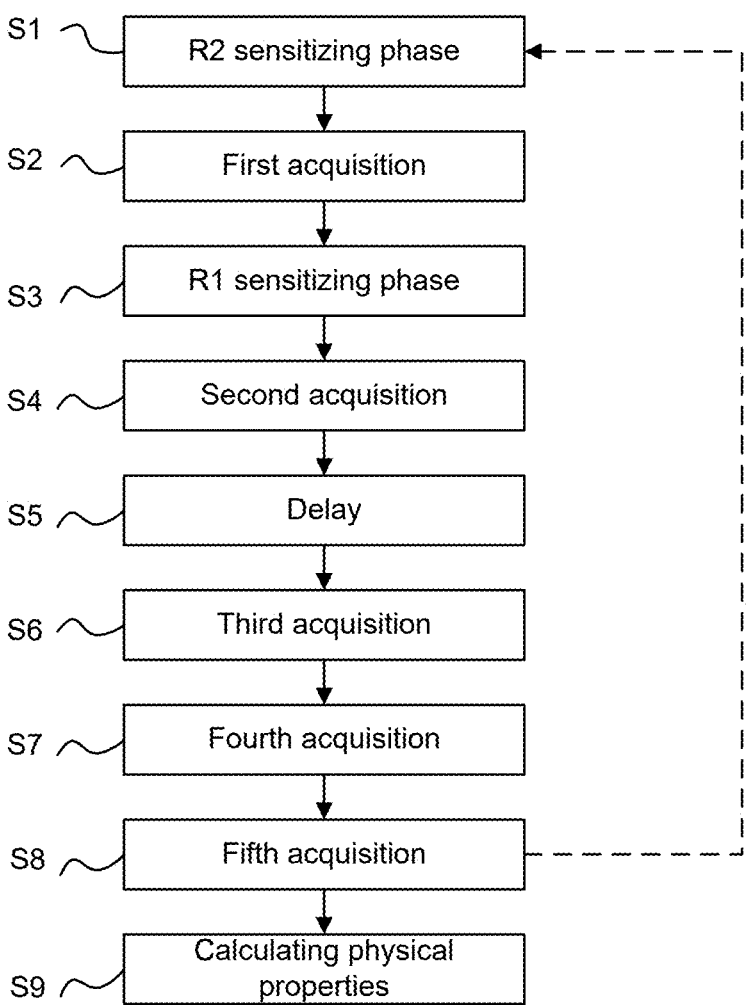
FIG. 1 is a flow chart of an example MR imaging method.

As shown in FIG. 1, after the step of acquiring a third acquisition (S6), the method may comprise acquiring a fourth acquisition (S7) and acquiring a fifth acquisition (S8).

The multiple parallel, segmented acquisitions may be performed on a two-dimensional (2D) slice, or a three-dimensional (3D) slice of the object.

The slice of the object may comprise at least a part of a liver, of a pancreas, of a kidney, of a heart, or any other organs of a human or an animal.

In connection with FIG. 2, the method of FIG. 1 comprising five parallel, segmented acquisitions will be discussed in detail.

Figure 2:
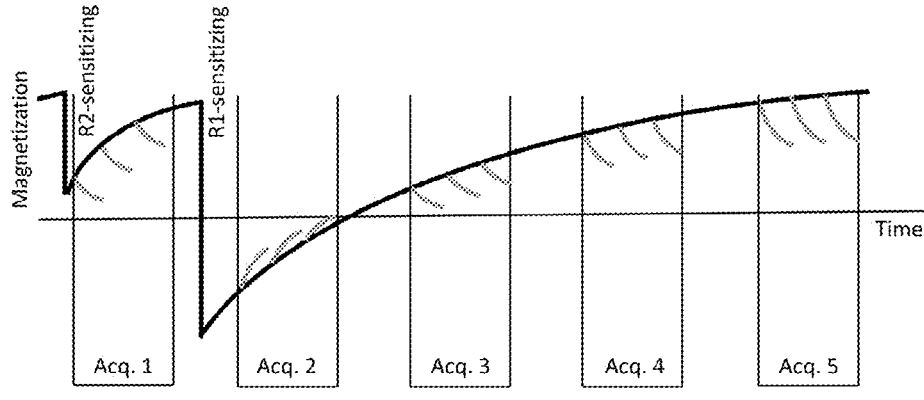
FIG. 2 is a schematic outline of an example MR sequence with five parallel, segmented acquisitions.

In FIG. 2, following an initial magnetization, five segmented, parallel acquisitions are performed. Prior to the first acquisition, an R2-sensitizing phase is applied to alter the magnetization proportional to the R2 relaxation rate. Then, prior to the second acquisition, an R1-sensitizing phase is applied to invert the magnetization, after which R1 relaxation occurs. There is also a delay (not shown in FIG. 2) between the second and the third acquisition.

For each acquisition, three echoes are measured at different echo times as shown in FIG. 2. Measuring at least three echoes for each acquisition instead of measuring a single echo, the signal intensities of water and fat of the object that alternates between in-phase and out-of-phase can be captured, as well as the T2* relaxation time.

Thus, by replacing the single echo read-out during the acquisition of 3D-QALAS with measuring at least three echoes at different echo times (TE), the method of the present description can also calculate physical properties of the object in addition to the T1 relaxation time (R1 relaxation rate), T2 relaxation time (R2 relaxation rate), and proton density (PD) of the object.

The method may comprise performing a multi-echo Dixon imaging for measuring the at least three echoes.

Among the at least three echoes, at at least one echo, water and fat of the object are in-phase, and at at least another echo, water and fat of the object are out-of-phase.

When the water and fat are out-of-phase (e.g., 180°), the fat signal is subtracted from the water signal. When the water and fat are in-phase (e.g., 0° or 360°), the fat and water signals are additive. Thus, the differences between the at least three echoes can be used to calculate the fat and water fractions, respectively.

The method may comprise repeating the step of acquiring multiple parallel, segmented acquisitions from the object for MR image reconstruction.

When the method comprises acquiring three parallel, segmented acquisitions from the object, the method may comprise repeating the step of acquiring three parallel, segmented acquisitions from the object for MR image reconstruction. In other words, after the third acquisition (S6), the method may repeat the steps of applying an R2 sensitizing phase (S1), acquiring a first acquisition (S2), . . . acquiring the third acquisition (S6), for at least once, for MR image reconstruction.

When the method comprises acquiring five parallel, segmented acquisitions from the object, the method may comprise repeating the step of acquiring five parallel, segmented acquisitions from the object for MR image reconstruction. In other words, after the fifth acquisition (S8), the method may repeat the steps of applying an R2 sensitizing phase (S1), acquiring a first acquisition (S2), . . . acquiring the fifth acquisition (S8), for at least once, for MR image reconstruction.

The method may comprise repeating the step of acquiring multiple parallel, segmented acquisitions until k-space is sufficiently filled for MR image reconstruction.

K-space is a mathematical concept used in MRI, which refers to a frequency space in which the raw MRI data is filled. This space may be considered as a grid-like matrix where each point represents a specific frequency and phase of the MRI signal. The K-space is filled by performing acquisitions by sequentially varying the magnetic field gradients during the MRI scan, allowing the reconstruction of an MR image through a mathematical transformation, such as Fourier transformation.

The method may comprise repeating the step of acquiring multiple parallel, segmented acquisitions from the object for at least twice.

In connection with FIG. 3, another example method will be discussed in detail.

Each acquisition of the method may comprise measuring at least four echoes at different echo times (TE).

For calculating multiple physical properties, instead of performing three acquisitions each measuring three echoes, in practice, it would be at least five acquisitions, each measuring at least four echoes, for a better calculation result.

Figure 3:
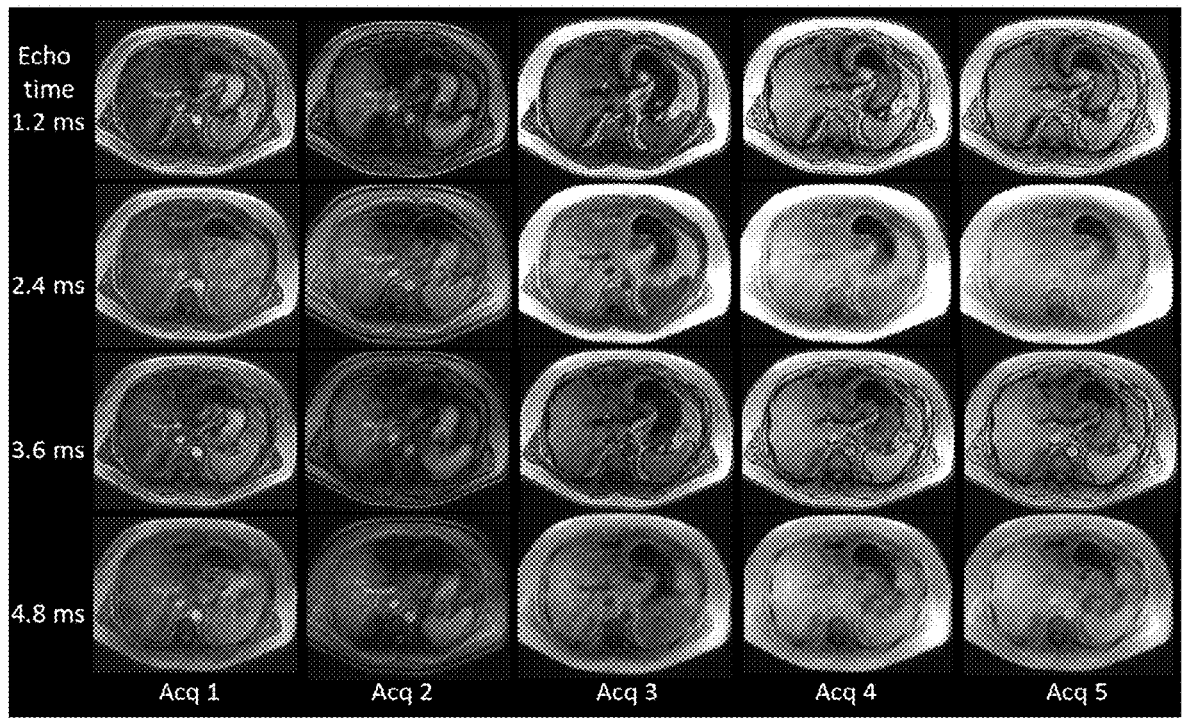
FIG. 3 are example MR images resulted by performing an example method.

As the MR images illustrated in FIG. 3, five acquisitions of a single MR scan were performed on a liver of a patient, each measuring four echoes at four different echo times, i.e. at 1.2 ms, 2.4 ms, 3.6 ms and 4.8 ms, respectively. Thus, the five acquisitions resulted twenty echo measurements (5 acquisitions×4 echoes) as shown in FIG. 3.

In FIG. 3, for each column, the four MR images represent the measured signal intensity of the four echoes of one acquisition at 1.2 ms, 2.4 ms, 3.6 ms and 4.8 ms, respectively.

In contrast, 3D-QALAS would result in only one row of MR images with five acquisitions. For example, five acquisitions each measuring at a single echo time, e.g., at 2.4 ms, would result in only the five MR images of the second row from top in FIG. 3.

Therefore, as shown in FIG. 3, the method can acquire a matrix of data sets or MR images (multiple acquisitions× multiple echoes) comprising quantitative information for calculating multiple physical properties of the object.

For example, R1 and R2 relaxation rate (T1 and T2 relaxation time) and PD can be calculated based on at least two acquisitions, e.g., one row of the MR images of FIG. 3.

Since T2* is a representative of a general decline of the MR signal intensity, T2* relaxation time (R2* relaxation rate) can be determined based on at least three echoes of a single acquisition, e.g., any one column of the MR images of FIG. 3.

Since water is proportional to the sum of all echoes and fat is proportional to the difference of the in-phase echoes and the out-of-phase echoes, water fraction and fat fraction of the object can be determined based on at least three echoes of a single acquisition, e.g., any one column of the MR images of FIG. 3.

Hence, the acquisitions, e.g., the MR images of FIG. 3, can provide information for calculating multiple physical properties of the object, such as R1 relaxation rate, R2 relaxation rate, T1 relaxation time, T2 relaxation time, proton density (PD), T2* relaxation time, a water fraction, a fat fraction, etc.

A signal intensity I can be modelled based on the quantitative information of the acquisitions as below Equation 1.

$$I = W\left[M0w - (M0w - MIw) * \exp\left(-\frac{TI}{T_1 w}\right)\right] *$$
$$\exp\left(-\frac{TE}{T_2^* w}\right) * \exp(i\varphi_0 + iATE) +$$
$$F\left[M0f - (M0f - MIf) * \exp\left(-\frac{TI}{T_1 f}\right)\right] * \exp\left(-\frac{TE}{T_2^* f}\right) * \exp(i\varphi_0 + iBTE) \tag{1}$$

The variables and parameters of the Equation 1 are provided in the following list:

I is signal intensity,

W is the water fraction,

M0w is an unsaturated magnetization of water,

MIw is a magnetization of water directly after an inversion pulse,

TI is a delay time after an inversion pulse, $T_1 w$ is a T1 relaxation time of water, TE is an echo time after each RF pulse, $T_2^* w$ is a $T2^*$ relaxation time of water, $\varphi_0$ is a starting phase at TE=0, A is a phase evolution of water, F is a fat fraction, M0f is an unsaturated magnetization of fat, MIf is a magnetization of fat directly after an inversion pulse, $T_1 f$ is a T1 relaxation time of fat, $T_2^* f$ is a $T2^*$ relaxation time of fat, and B is a phase evolution of fat.

According to the Equation 1, the signal intensity I consists of two components, i.e. the signal intensity Iw of the water fraction of the object, and the signal intensity If of the fat fraction of the object, respectively, as below Equations 2 and 3.

$$Iw = W\left[M0w - (M0w - MIw) * \exp\left(-\frac{TI}{T_1 w}\right)\right] * \exp\left(-\frac{TE}{T_2^* w}\right) * \exp(i\varphi_0 + iATE) \tag{2}$$

$$If = F\left[M0f - (M0f - MIf) * \exp\left(-\frac{TI}{T_1 f}\right)\right] * \exp\left(-\frac{TE}{T_2^* f}\right) * \exp(i\varphi_0 + iBTE) \tag{3}$$

The Equation 1 can be expanded by dividing the fat fraction F into multiple components, each with a separate amplitude and phase evolution B.

The Equation 1 can also be simplified by assuming that $T_1w$ and $T_1f$ are identical, and $$T_2^*w \text{ and } T_2^*f$$

are identical, such that the measured T1 and T2* relaxation time is the effective relaxation time of both water and fat.

The acquired data (e.g., the MR images of FIG. 3) may be further processed. One example is to further process the acquired data to generate MR images specifically for fat and specifically for water of each acquisition.

Figure 4:
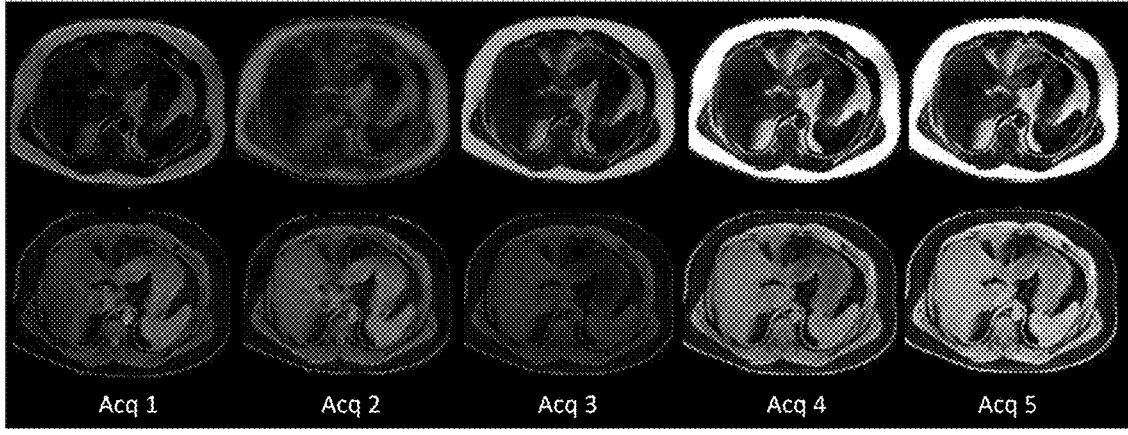
FIG. 4 are example MR images for fat and water.

FIG. 4 has two rows of MR images. The top row are the MR images specifically for fat of the five acquisitions, and the bottom row are the MR images specifically for water of the five acquisitions, based on the MR images of FIG. 3. Thus, the top row can show the effects of R1 and R2 relaxation of fat only, and the bottom row can show the effects of R1 and R2 relaxation of water only.

Further processing of these two rows of fat water separated MR images can provide an estimate of R1 and R2 relaxation rate specifically for fat and specifically for water, respectively.

Since both rows were generated by processing the MR images of FIG. 3, it also demonstrates that the signal intensity/of the Equation 1 can be separated into a water component and a fat component.

In connection with FIG. 5, multiple MR parameter maps generated by an example method will be discussed in detail.

An MR parameter map is known to be a visual representation of the quantitative values of a specific MR parameter of an object (a physical property of the object). Thus, an MR parameter map is an effective way to visualize the calculated physical properties or parameters.

The MR parameter maps can visualize quantitative information of a region of a particular tissue or organ. Such maps are valuable as they provide quantitative information about the specific tissues being imaged, which can facilitate not only diagnosing, but also monitoring pathological changes, evaluating tissue properties, etc.

Figure 5:
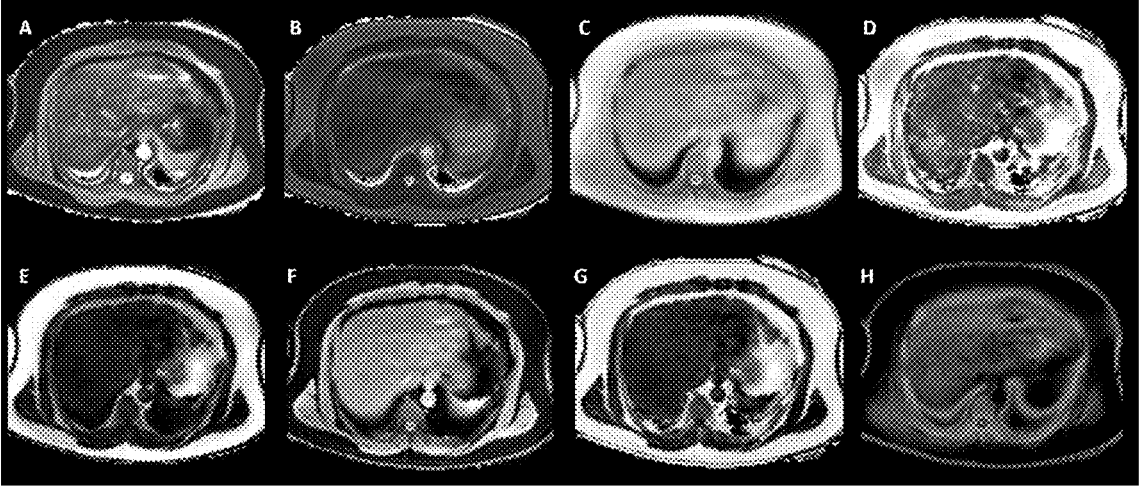
FIG. 5 are MR parameter maps generated according to an example method.

FIG. 5 consists of eight parameter maps, i.e. A) effective T1 relaxation time map, B) effective T2 relaxation time map, C) PD map, D) effective T2* relaxation time map, E) fat fraction map, F) water fraction map, G) Proton Density fat fraction (PDFF) map, and H) macro-molecular fraction map.

The quantitative values of the parameter maps of FIG. 5 were calculated based on one slice of twenty acquired slices of a single MR scan performed on the entire liver of a patient in a single 15 second's breath-hold by the method of the present description.

With the advent of fast reconstruction methods, such as Artificial Intelligence (AI), the obtained resolution of the parameter maps and number of slices can increase. The method can also be applied free-breathing when an appropriate selection of the acquired k-space lines is applied to suppress motion effects due to breathing.

The A) effective T1 relaxation time map, B) effective T2 relaxation time map, and C) PD map of FIG. 5 will be discussed in detail.

The step of calculating multiple physical properties of the object may comprise calculating T1 relaxation time based on those acquisitions which are performed after the step of applying the R1 sensitizing phase.

For example, the acquired MR data of the second and the third acquisition can be used for calculating the T1 relaxation time.

The step of calculating multiple physical properties of the object may comprise calculating T1 relaxation time based on signal intensities of the MR images of those acquisitions which are performed after the step of applying the R1 sensitizing phase.

The step of calculating multiple physical properties of the object may comprise calculating PD based on those acquisitions which are performed after the step of applying the R1 sensitizing phase.

An additional advantage of the method is that the absolute PD can be measured, i.e. the total number of visible protons in each voxel of the scanned volume. PD can vary between 0% and 100%, where 100% corresponds to pure water. These protons can either be protons of water or of fat, providing the water fraction and the fat fraction. Thus, the sum of water fraction and fat fraction may be considered to be identical to the calculated PD.

The step of calculating multiple physical properties of the object may comprise calculating T2 relaxation time based on those acquisitions which are performed before and after the step of applying the R2 sensitizing phase.

At least one acquisition before and at least one acquisition after the R1 sensitizing phase may be needed for calculating the T2 relaxation time. For example, the acquired MR data of the first and the second acquisition can be used for calculating the T2 relaxation time. The first and the third acquisition can also be used for calculating the T2 relaxation time.

The step of calculating multiple physical properties of the object may comprise calculating T2 relaxation time based on signal intensities of MR images of those acquisitions performed before and after the step of applying the R2 sensitizing phase.

The D) effective T2* relaxation time map of FIG. 5 will be discussed in detail.

The step of calculating multiple physical properties of the object may comprise calculating T2* relaxation time based the at least three echoes of at least one acquisition of the at least three acquisitions.

The step of calculating multiple physical properties of the object may comprise calculating T2* relaxation time based on changes of signal intensities, such as decrease of signal intensities, of MR images of the at least three echoes of any one of the multiple parallel, segmented acquisitions The E) fat fraction map, and F) water fraction map of FIG. 5 will be discussed in detail.

The step of calculating multiple physical properties of the object may comprise calculating a water fraction and a fat fraction based on at least two echoes of the at least three echoes of at least one acquisition of the multiple parallel, segmented acquisitions.

The step of calculating multiple physical properties of the object may comprise calculating a water fraction and a fat fraction based on signal intensities differences and/or phase differences of MR images of the at least three echoes of the at least one acquisition.

The H) macro-molecular fraction map of FIG. 5 will be discussed in detail.

The step of calculating multiple physical properties of the object may comprise calculating a macro-molecular fraction by using 100% subtracting a sum of the water fraction and the fat fraction.

The calculated PD can be lower than 100%, even though each voxel within the object obviously must contain 100% tissue. The absence of signal is caused by the presence of non-lipid and non-aqueous material, e.g., macro-molecular.

The macro-molecular fraction may be calculated as 100%—PD, which is equivalent to 100% minus water fraction minus fat fraction.

The macro-molecular fraction may provide insight into different diseases, e.g., liver fibrosis, as this fraction may increase when more scarred tissue is present.

The G) Proton Density fat fraction (PDFF) map of FIG. 5 will be discussed in detail.

The step of calculating multiple physical properties of the object may comprise calculating proton density fat fraction (PDFF) by dividing the fat fraction by the sum of the water fraction and the fat fraction.

In routine clinic, the water fraction and fat fraction maps are generally not directly used. Instead, a proton density fat fraction (PDFF) map is calculated, corresponding to the tissue fat fraction divided by the sum of the fat fraction and water fraction (F/(F+W)). This is equivalent to the PD signal of fat, divided by the total PD signal.

Therefore, as shown in FIG. 5, with multiple parallel, segmented acquisitions of a single MR scan, multiple physical properties of the object can be calculated according to the method of the present description with an improved accuracy and a reduced scan time.

The generated parameter maps (such as FIG. 5) can be used to generate weighted MR images (synthetic MR images). For example, the weighted MR images may be synthesized by using T1, T2 and PD maps, in combination with different scanner settings, such as echo time, repetition time and inversion delay time, etc., to mimic images that were acquired with those scanner settings.

Figure 6:
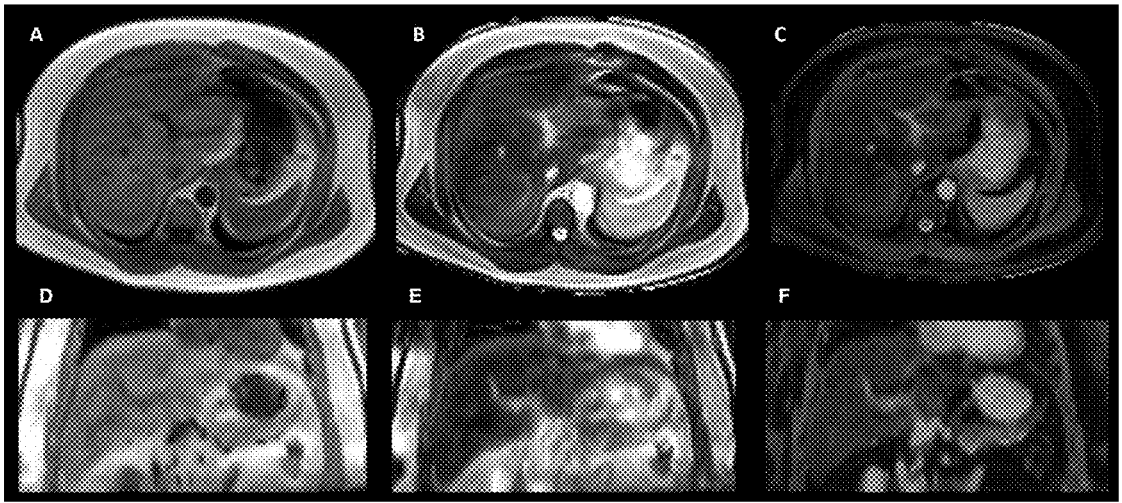
FIG. 6 are synthetic MR images based on the parameter maps of FIG. 5.

FIG. 6 illustrates multiple synthetic MR images generated based on the parameter maps of FIG. 5.

The top row of FIG. 6 are: A) synthetic T1-weighted image, B) synthetic T2-weighted image, and C) synthetic Proton Density Short Tau Inversion Recovery (PD-STIR) image, in an axial reformat of the quantitative information of the liver of the patient of FIG. 5.

The bottom row of FIG. 6 are: D) synthetic T1-weighted image, E) synthetic T2-weighted image, and F) synthetic Proton Density Short Tau Inversion Recovery (PD-STIR) image, in a coronal reformat of the quantitative information of the liver of the patient of FIG. 5.

These synthetic images are very similar to the conventionally acquired T1W, T2W and PD-STIR images.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A method of magnetic resonance (MR) imaging of an object positioned in an examination volume of an MR scanning device, the method comprising:
   acquiring, by the MR scanning device, multiple parallel, segmented acquisitions from the object, comprising:
      applying an R2 sensitizing phase;
      acquiring a first acquisition;
      applying an R1 sensitizing phase;
      acquiring a second acquisition;
      waiting for a delay time; and
      acquiring a third acquisition;
   wherein each acquisition comprises measuring at least three echoes at different echo times (TE);

calculating multiple physical properties of the object based on at least some of the at least three acquisitions, wherein calculating multiple physical properties of the object comprises:
      calculating a water fraction and a fat fraction based on at least two echoes of the at least three echoes of at least one acquisition of the multiple parallel, segmented acquisitions; and
      calculating a macro-molecular fraction by using 100% subtracting a sum of the water fraction and the fat fraction.

2. A magnetic resonance imaging (MRI) system, comprising:
   an MR scanning device, configured to acquire multiple parallel, segmented acquisitions from an object positioned in an examination volume of the MR scanning device;
   wherein the MR scanning device is configured to:
      apply an R2 sensitizing phase;
      acquire a first acquisition;
      apply an R1 sensitizing phase;
      acquire a second acquisition;
      wait for a delay time; and
      acquire a third acquisition;
   wherein each acquisition comprises measuring at least three echoes at different echo times (TE); and
   a processing circuit, configured to calculate multiple physical properties of the object based on at least some of the at least three acquisitions, wherein to calculate multiple physical properties of the object comprises:
      to calculate a water fraction and a fat fraction based on at least two echoes of the at least three echoes of at least one acquisition of the multiple parallel, segmented acquisitions; and
      to calculate a macro-molecular fraction by using 100% subtracting a sum of the water fraction and the fat fraction.

3. The method according to claim 1, comprising:
   repeating the step of acquiring multiple parallel, segmented acquisitions from the object for MR image reconstruction.

4. The method according to claim 1, comprising:
   after the step of acquiring a third acquisition, acquiring a fourth acquisition; and
   acquiring a fifth acquisition.

5. The method according to claim 1, wherein each acquisition comprises measuring at least four echoes at different echo times (TE).

6. The method according to claim 1, wherein the multiple physical properties comprise any of: R1 relaxation rate, R2 relaxation rate, T1 relaxation time, T2 relaxation time, proton density (PD), T2* relaxation time, a water fraction, a fat fraction, a macro-molecular fraction, and proton density fat fraction (PDFF).

7. The method according to claim 1, wherein the R2 sensitizing phase consists of a 90° Radio Frequency (RF) pulse, at least one refocusing pulse, and a −90° RF pulse.

8. The method according to claim 1, wherein the R1 sensitizing phase comprises a 180° RF inversion pulse.

9. The method according to claim 1, wherein the step of calculating multiple physical properties of the object comprises:
   calculating T1 relaxation time based on those acquisitions of the multiple parallel, segmented acquisitions which are performed after the step of applying the R1 sensitizing phase; and/or

calculating T2 relaxation time based on those acquisitions of the multiple parallel, segmented acquisitions which are performed before and after the step of applying the R2 sensitizing phase.

10. The method according to claim 1, wherein the step of calculating multiple physical properties of the object comprises:

calculating T2* relaxation time based the at least three echoes of at least one acquisition of the multiple parallel, segmented acquisitions.

11. The method according to claim 1, wherein the step of calculating multiple physical properties of the object comprises:

calculating proton density fat fraction (PDFF) by dividing the fat fraction by the sum of the water fraction and the fat fraction.

12. The method according to claim 1, wherein T1 relaxation time, T2 relaxation time, T2* relaxation time, Proton Density PD, a water fraction and a fat fraction are calculated using the following equation:

$$I =$$

$$W\left[M0w - (M0w - MIw) * \exp\left(-\frac{TI}{T_1w}\right)\right] * \exp\left(-\frac{TE}{T_2^*w}\right) * \exp(i\varphi_0 + iATE) +$$

$$F\left[M0f - (M0f - MIf) * \exp\left(-\frac{TI}{T_1f}\right)\right] * \exp\left(-\frac{TE}{T_2^*f}\right) * \exp(i\varphi_0 + iBTE)$$

wherein I is signal intensity,

W is the water fraction,

M0w is an unsaturated magnetization of water,

MIw is a magnetization of water directly after an inversion pulse,

TI is a delay time after an inversion pulse, $T_1w$ is a T1 relaxation time of water, TE is an echo time after each RF pulse, $T_2^*w$ is a $T2^*$ relaxation time of water, $\varphi_0$ is a starting phase at TE=0, A is a phase evolution of water, F is a fat fraction, M0f is an unsaturated magnetization of fat, MIf is a magnetization of fat directly after an inversion pulse, $T_1f$ is a T1 relaxation time of fat, $T_2^*f$ is a $T2^*$ relaxation time of fat, and B is a phase evolution of fat.

13. The method according to claim 1, wherein among the at least three echoes, at least one echo when water and fat of the object are in-phase, and at least another echo when water and fat of the object are out-of-phase.

14. The method according to claim 1, wherein the method comprises repeating the step of acquiring multiple parallel, segmented acquisitions from the object for at least twice.

15. The method according to claim 1, wherein each acquisition comprises performing a multi-echo Dixon imaging for measuring the at least three echoes.

16. The method according to claim 1, wherein the multiple parallel, segmented acquisitions are performed on a two-dimensional (2D) slice, or a three-dimensional (3D) slice of the object.

17. A non-transitory computer readable recording medium having computer readable program code recorded thereon which when executed on a device having processing capability is configured to perform the method of claim 1.

18. The method according to claim 16, wherein the slice of the object comprises at least a part of a liver, of a pancreas, of a kidney, of a heart, or any other organs, of a human or an animal.

\* \* \* \* \*